United States Patent [19]

Musket et al.

[11] Patent Number: 4,976,987

[45] Date of Patent: Dec. 11, 1990

[54] PROCESS FOR FORMING ONE OR MORE SUBSTANTIALLY PURE LAYERS IN SUBSTRATE MATERIAL USING ION IMPLANTATION

[75] Inventors: Ronald G. Musket, San Ramon; David W. Brown, Livermore; Zuhair A. Munir, Davis, all of Calif.

[73] Assignee: The United States of America as represented by the Department of Energy, Washington, D.C.

[21] Appl. No.: 391,904

[22] Filed: Aug. 10, 1989

[51] Int. Cl.$^5$ .................. B05D 3/06; B05D 5/12; C23C 14/00

[52] U.S. Cl. .................................... 427/38; 427/123; 204/192.15; 204/192.3

[58] Field of Search ................... 427/38, 39, 123; 204/192.15, 192.12, 192.1, 192.3; 437/16, 20, 24

[56] References Cited

U.S. PATENT DOCUMENTS

| | | | |
|---|---|---|---|
| 4,262,056 | 4/1981 | Hubler et al. | 427/38 |
| 4,465,337 | 8/1984 | Baron et al. | 427/38 |
| 4,576,697 | 3/1986 | Palmer | 427/38 |
| 4,700,454 | 10/1987 | Baerg et al. | 437/24 |
| 4,704,302 | 11/1987 | Bruel et al. | 427/38 |
| 4,749,660 | 6/1988 | Short et al. | 437/24 |
| 4,751,100 | 6/1988 | Ogawa | 427/38 |
| 4,759,836 | 7/1988 | Hill et al. | 427/38 |
| 4,786,608 | 11/1988 | Griffith | 437/24 |

OTHER PUBLICATIONS

Buene et al., "Metastable Alloys of Be Prepared by Ion Implantation", *Metallurgical Transactions A*, vol. 15A, Oct. '84 pp. 1787-1805.

Myers et al., "Phase Equilibria & Diffusion in Be-Al-Fe System Using High Energy Ion Beams", *Metallurgical Transactions A*, vol. 7A, Jun. 76, pp. 795-802.

*Primary Examiner*—Norman Morgenstern
*Assistant Examiner*—M. L. Padgett
*Attorney, Agent, or Firm*—Leona Lauder; L. E. Carnahan; William R. Moser

[57] ABSTRACT

A process is disclosed for forming a substantially pure layer of an implantable element in a substrate material by (a) selecting an implantable element and a substrate material to be implanted which, at the temperatures to be used, have limited mutual solubility in one another and do not form any intermediate phases with one another; (b) implanting a sufficient amount of the implantable element in the substrate material to permit formation of the desired substantially pure layer of the implantable element in the substrate material; and (c) annealing the implanted substrate material to form the desired layer. The annealing step may not be required if the desired layer was formed during the implantation.

27 Claims, 2 Drawing Sheets

```
┌─────────────────────────────────────┐
│   FORMING A SUBSTANTIALLY PURE      │
│   LAYER IN A SUBSTRATE BY: FIRST    │
│   SELECTING AN IMPLANTABLE ELEMENT  │
│   AND A SUBSTRATE WHICH HAVE LIMITED│
│   MUTUAL SOLUBILITY IN ONE ANOTHER  │
│   AND DO NOT FORM INTERMEDIATE      │
│   PHASES WITH ONE ANOTHER;          │
└─────────────────┬───────────────────┘
                  │
┌─────────────────┴───────────────────┐
│   IMPLANTING SUFFICIENT ATOMS/CM²   │
│   OF THE IMPLANTABLE ELEMENT INTO   │
│   THE SUBSTRATE AT AN ENERGY        │
│   LEVEL OF AT LEAST 5 keV; AND      │
└─────────────────┬───────────────────┘
                  │
┌─────────────────┴───────────────────┐
│     ANNEALING THE IMPLANTED         │
│   SUBSTRATE AT A TEMPERATURE NOT    │
│   EXCEEDING 10°C BELOW THE MELTING  │
│     POINT OF THE SUBSTRATE          │
└─────────────────────────────────────┘
```

FIG. 1

PROCESS FOR FORMING ONE OR MORE SUBSTANTIALLY PURE LAYERS IN SUBSTRATE MATERIAL USING ION IMPLANTATION

BACKGROUND OF THE INVENTION

The invention described herein arose in the course of, or under, Contract No. W-7405-ENG-48 between the United States Department of Energy and the University of California.

This invention relates to a process for forming one or more substantially pure layers of an element in a material. More particularly, this invention relates to the formation of one or more substantially pure layers of an element in another element, compound, or solid solution by ion implantation.

Implantation of small amounts of ions of a particular element into a substrate such as crystalline silicon is well known in the construction of integrated circuit structures. For example, elements such as boron, phosphorus, or arsenic are implanted into a silicon substrate in small amounts to alter the electrical properties of the silicon. It is also known to implant oxygen atoms into a silicon substrate in large concentrations to form silicon oxide layers by the combination or reaction of the implanted oxygen ions with the silicon in the substrate.

For example, Baerg et al U.S. Pat. No. 4,700,454 teaches the implantation of a silicon substrate with oxygen ions to form an insulating layer and states that other ions which will react with silicon to form an insulative layer may be used instead of oxygen, such as nitrogen, to form a silicon nitride-like layer. Short et al U.S. Pat. No. 4,749,660 teaches implanting sufficient oxygen ions into a silicon substrate to form a maximum concentration of two oxygen atoms per silicon atom to form a buried $SiO_2$ layer in the silicon substrate. Griffith U.S. Pat. No. 4,786,608 also teaching the formation of a silicon oxide buried layer in a silicon substrate by oxygen ion implantation.

Implantations of other elements into an elemental substrate without reaction of the substrate atoms and the implanted ions to form a compound such as the abovedescribed silicon oxide compound are also known. For example, Myers and Smugeresky, in an article entitled "Phase Equilibria and Diffusion in the Be-Al-Fe System Using High Energy Ion beams", published in Metallurgical Transactions, Vol. 7A, at pp. 795–802 in 1976, describe the implantation of single crystal beryllium with 30–50 keV aluminum in dosages of $2-6 \times 10^{16}$ aluminum atoms/cm$^2$ (i.e., peak aluminum concentrations <10 atomic %) followed by annealing at temperatures of 600° C. and 800° C. The authors reported observation of aluminum precipitates using transmission electron microscopy (TEM) after annealing Buene et al, in an article entitled "Metastable Alloys of Beryllium Prepared by Ion Implantation", published in Metallurgical Transactions, Vol. 15A, at pp. 1787–1804 in 1984, reported the implantation of beryllium with zinc at an energy of 185 keV with a $1.6 \times 10^{17}$ zinc atoms/cm$^2$. Annealing at 600° C. for 10 minutes resulted in an increase in the peak zinc concentration of from 12 to about 17 atomic %.

However, others have not reported the formation of a substantially pure layer of an implanted element formed in another element, compound, or solid solution as a result of ion implantation. This is not surprising since sputtering of both the implanted substrate as well as atoms of the implanted element during implantation would appear to limit the maximum concentration of the implanted element in the substrate obtainable using ion implantation. Furthermore, diffusion of the implanted element away from the highest concentration regions during both the implant and the subsequent annealing step would also appear to limit the maximum concentration of the implanted element in the substrate obtainable by implantation. Finally, precipitation of intermediate phases containing elements of the substrate and the implanted element would be expected to interfere with the formation of the elemental layer.

SUMMARY OF THE INVENTION

It is, therefore an object of this invention to provide a method for forming a substantially pure layer of an element into a substrate material which comprises another element, compound, or solid solution using ion implantation.

In accordance with the invention, the method comprises: (a) selecting an implantable element and a substrate material to be implanted which, at the temperatures to be used for the implantation and any subsequent anneal, (i) have limited mutual solubility in one another; and (ii) have an absence of intermediate phases formable between the implantable element and the material comprising the implanted substrate; and (b) implanting a sufficient amount of the implantable element to form the desired substantially pure layer of the implanted element in the substrate material either during implantation or during a subsequent anneal. In a preferred embodiment, an annealing step follows the implantation step.

BRIEF DESCRIPTION OF THE DRAWINGS

FIG. 1 is a flow sheet illustrating the process of the invention.

DETAILED DESCRIPTION OF THE INVENTION

Figure 2:
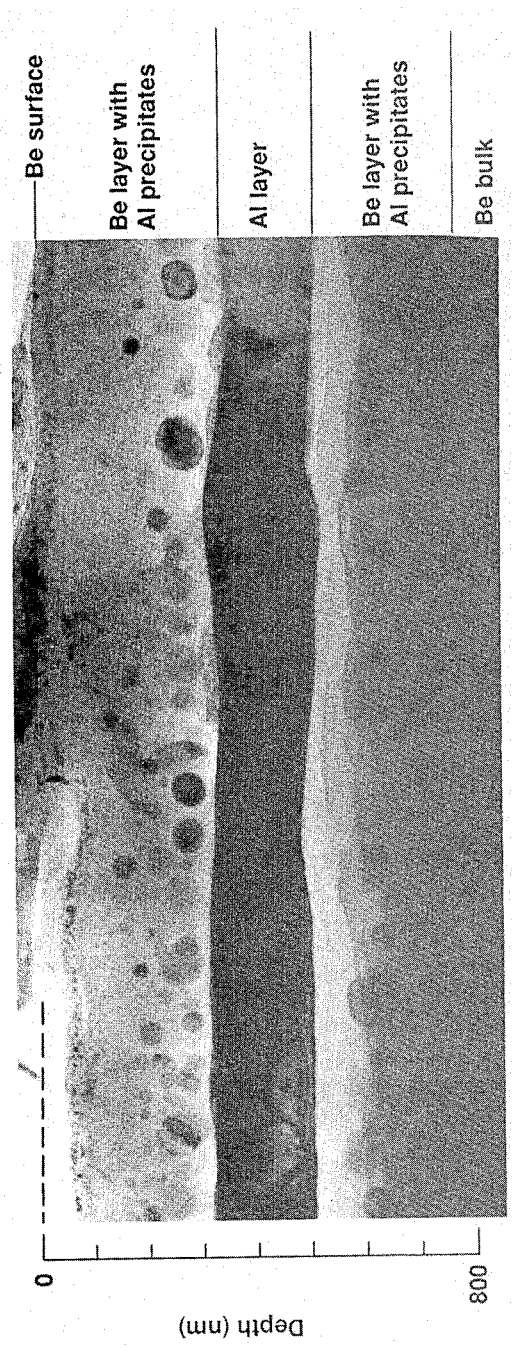
FIG. 2 is a fragmentary cross-sectional view of a substrate having a substantially pure layer of an implanted element formed therein

The invention comprises a process for forming a substantially pure layer of an element in a substrate which may comprise another element, a compound, or a solid solution of one or more elements in one or more elements By use of the term "substantially pure" with respect to the implanted layer is meant a layer of an implantable element having a purity determined by the solubility of the substrate material in the implanted element, but being at least 90 atomic percent (at. %).

By use of the term "layer" is meant that there is a region throughout that area of the substrate being implanted, containing mainly the implanted element, centered at some depth with a finite width such that the substrate and this region containing the implanted element are separated by an interphase boundary.

While the process of the invention may be used in connection with a number of materials, an important part of the process is the screening of materials for certain properties which must be exhibited prior to successful use of the materials in the process.

First of all, the element to be implanted in the substrate, sometimes herein referred to as either the "implantable element" or the "implanted element", and the substrate must have a limited solubility in one another at the temperatures used for implantation and for annealing of the implanted substrate. Thus, for example, the implantation of copper into nickel would form a copper/nickel solid solution because of the large mutual solubility of copper and nickel in one another. Such materials could not therefore, be used together in the practice of this invention.

By "limited mutual solubility" is meant that the solubility of the implantable element in the substrate material is less than 10 at. %, preferably less than 5 at. %, and the solubility of the substrate material in the implantable element is less than 10 at. %, preferably less than 5 at. %.

Second, there must exist a finite temperature range in part of the phase diagram showing only the pure implantable element on one side and only the pure substrate material on the other side, without any intermediate phases in that temperature range. Thus, for example, the implantation of oxygen or nitrogen ions into a silicon substrate would be excluded from this process since both oxygen and nitrogen are reactive with silicon to form an intermediate phase consisting of silicon oxide ($SiO_2$) or silicon nitride ($Si_3N_4$) when the respective ions are implanted into silicon at an implantation temperature of 350° C.

Examples of implantable elements and substrate materials into which the implantable elements are shown in Table I, which is intended to be representative only. It also should be noted that the elements listed as suitable substrate materials may be interchanged with any one of the implantable elements listed for that substrate. For example, where Be, Al, Zn, Ag, Cd, Sn, Au, and Pb are listed in Table I as implantable elements in a silicon substrate, silicon may, instead be the implantable element in a substrate consisting of any one of those listed elements.

TABLE I

| | Substrate | Implantable Element |
|---|---|---|
| 1. | Be | Li, Al, Si, Zn, Ge, Ag, Sn |
| 2. | C | Cu, Zn, As, Ag, Cd, Sn, Au |
| 3. | Al | Na, K, Si, Zn, Ge, As, Cd, Pb |
| 4. | Si | Be, Al, Zn, Ag, Cd, Sn, Au, Pb |
| 5. | Ti | Li, Mg, Y, La, Ce, Pu |
| 6. | Fe | Li, Na, Mg, Ca, Cu, Ag, Cd, Sn, Pb |
| 7. | Ni | Li, Na, K, Ag, Pb |
| 8. | Cu | Li, C, Na, Cr, Fe, Mo, Ag, W, Pb |
| 9. | Ge | Be, Al, Zn, Ag, Cd, Au, Pb |
| 10. | U | Li, Na, Mg, Ca, Cr, Ag, W, Ce |

The suitability of other pairs of elements for use, respectively, as the implantable element and the substrate in the practice of this invention may be readily determined, for example, by consulting the "Atlas of Binary Alloys" by Staudhammer and Murr, published in 1973 by Marcel Dekker, Inc. of New York. When a pair of elements are listed as not forming one or more intermediate phases, the phase diagram for these two elements should be consulted for limited mutual solubility between the pair in a particular temperature range shown on the phase diagram.

It should be noted here that the substrate into which the implantable element will be implanted may be an element, a compound, or a solid solution. However, the criteria discussed above apply equally whether or not the substrate is a single element or comprises more than one element. Whether the substrate comprises a single element, a compound, or a solid solution, the portion of the substrate being implanted should consist of a single-phase solid material. That is, the entire area of the substrate being implanted, over a depth range that will contain all of the implanted element, must be a homogeneous solid. Furthermore, the substrate may be monocrystalline, polycrystalline, or amorphous.

The purity of the implantable element which will be ionized in the ion source portion of the implantation apparatus will normally be at least 90 at. % and preferably at least about 95 at. %. It is recognized that in commercially available ion implantation apparatus in use today, the purity of the ion beam of the implantable element may be much higher due to the magnetic separation means through which the ion beam passes.

The purity of the element, compound, or solid solution comprising the substrate which is to be implanted by the implantable element should also have a purity of at least about 90 at. % and preferably at least about 95 at. %.

The temperatures used for the implantation will normally range from about 77° K. ($-196°$ C.) to about 10° C. below the melting point of the substrate. When a subsequent annealing step is carried out, the annealing temperatures will normally range from about 20° C. up to about 10° C. below the melting point of the substrate for a period of from about 1 second to about 100 hours, typically from about 0.2 to 2 hours.

It should be noted here that normally an annealing step will be carried out after the implantation step. However, in some instance where the implantation temperature is appropriately chosen, i.e., within the implantation temperature range, the annealing step may not be necessary.

It is, therefore, within these temperature ranges that one must screen the implantable element and the materials in the substrate to be implanted to determine whether or not, within these temperature ranges, these materials meet the above recited criteria of limited mutual solubility and lack of intermediate phases containing both the implantable element and the substrate material.

An additional criterion for the formation of the substantially pure layer of the implanted element is the extent of the implantation. This will include the energy of the implantable element, which will affect the depth of the implanted layer; and, most importantly, the amount or dosage of the implantable element which determines the concentration of the implanted element.

The energy of the implantable element may be varied to control the depth of the implantation, as stated above. The depth of the implanted element will also vary with the atomic mass of the implantable element. Normally, however, the energy of the implantable element will range from at least about 5 keV to about 2000 keV. As an example, the energy for the implantation of aluminum into beryllium ranges from about 5 keV (which will result in an implantation depth of about 11 nanometers (nm)) to about 2000 Kev (which will result in an implantation depth of about 1900 nm).

It should be noted here that it is within the scope of the invention to provide a shallow implant to form a substantially pure layer of the implanted element which will extend to the surface of the substrate. When such a shallow implant is desired, the energy of the ions of the implantable element will be kept on the low end of the energy range.

It should also be noted that it is within the scope of the invention to form more than one substantially pure layer of the same implantable element, i.e., two or more layers, in a single substrate. Such may be accomplished, for example, by carrying out a first implant at a higher energy, to form a first deeper layer, followed by a shallower implant at a lower energy. It is also within the scope of the invention to form two or more layers using different implantable elements for each layer, e.g., using a first implantable element to form the deeper layer and a second implantable element to form a second, shallower layer.

Even if all other criteria are met, failure to provide a certain minimum dosage of the implanted element will result in a failure to produce the substantially pure layer of implanted element of the invention. The minimum dosage, or fluence of the implantable element which must be implanted into the substrate to achieve the substantially pure layer of implanted element in accordance with the invention will be at least about $5 \times 10^{16}$ atoms/cm$^2$, preferably at least about $5 \times 10^{17}$ atoms/cm$^2$, and most preferably at least about $1.1 \times 10^{18}$. This minimum dosage will, however, vary with the mass of the implanted element, its energy, and the particular substrate material. Thus, for example, in the prior art implantation of aluminum into beryllium by Myers and Smugeresky and the implantation of zinc into beryllium by Buene et al, as discussed above, the failure to provide a sufficient minimum dosage probably resulted in a failure to produce the substantially pure layers of the implanted element of invention.

In a preferred embodiment the implantation, in accordance with the invention, will take place under conditions wherein sputtering, particularly sputtering of the substrate, will be inhibited or at least reduced to a level where the sputtering does not limit the implantation of sufficient atoms of the implantable element to form the substantially pure layer.

This may be accomplished by carrying out the implantation in the presence of a gas which will reduce the amount of sputtering, by the ion beam, of material from the surface of the substrate which is being implanted. Such gases react with the substrate material to form surface compounds that are sputtered more slowly than the substrate material.

Examples of gases which may be used to reduce the sputtering of either materials from the substrate being implanted or the implantable element include oxygen, water vapor, carbon dioxide, and nitrogen. The partial pressure of these gases in the implantation apparatus will range from about $10^{-7}$ to about $10^{-4}$ Torr.

Sputtering of the substrate during the implantation process may also be reduced by coating the substrate with a material having a lower sputtering rate than the substrate which will reduce such sputtering. Examples of such coating materials include beryllium, carbon and compounds such as beryllium oxide, silicon oxide, or aluminum oxide.

It should be noted that such coatings formed on the substrate to reduce sputtering, either by exposure to certain gases or by the use of coating materials applied to the substrate surface, do not need to meet the criteria for the implantable element or the substrate since such materials may be considered to be sacrificial materials which are either removed during the implantation (by sputtering) or may be removed after the implantation step.

If desired, after completion of the implantation process and formation of the substantially pure implanted layer in the substrate, a sufficient amount of the surface of the substrate, i.e., the surface layer, may also be removed by, for example, dry or wet etching means to expose the newly formed substantially pure implanted layer of the implantable element therein. Alternatively, as discussed above, the implanted substantially pure layer may be formed by a sufficiently shallow implant so as to extend the implanted layer to the surface of the substrate, thus making it unnecessary to remove any of the substrate material to expose the substantially pure implanted layer.

It should also be noted that if desired, a substantially pure patterned buried layer may be implanted by using an appropriate mask over the substrate or by using a focused ion beam or any other patterning means.

To further illustrate the process of the invention, a polycrystalline beryllium substrate was implanted with aluminum ions. For temperatures below 570° C., the solubility of aluminum is less than 0.007 atomic percent and the solubility of beryllium in aluminum is less than 0.1 atomic percent. The beryllium substrate had a purity of greater than 99 at. % and a thickness of about 2 mm. The aluminum ions were implanted into the beryllium substrate at an energy of 200 keV to a fluence of $1.1 \times 10^{18}$ aluminum atoms/cm$^2$ while maintaining the beryllium substrate at about 100° C. and in the presence of about $10^{-6}$ Torr of water vapor which tended to suppress sputtering. The aluminum-implanted beryllium substrate was then vacuum annealed at about $10^{-6}$ Torr at a temperature of about 570° C. for a period of about 1 hour. Cross-sectional transmission electron microscopy (XTEM) showed that an approximately 170 nm thick layer of substantially pure (>98 atomic %) aluminum had formed about 420 nm below the surface of the beryllium substrate, as shown in FIG. 2.

Thus, the invention provides a process for forming a substantially pure layer of an implantable element in a substrate when the implantable element is implanted to a certain minimum concentration and the implantable element and the materials in the implanted substrate have low mutual solubility in one another and do not form intermediate phases with one another.

While a specific embodiment of the process for implanting a substantially pure layer of an element into a substrate has been illustrated and described for carrying out the prccess in accordance with this invention, modifications and changes of the apparatus, parameters, materials, etc. will become apparent to those skilled in the art, and it is intended to cover in the appended claims all such modifications and changes which come within the scope of the invention.

What is claimed is:

1. A process for forming a substantially pure layer of an implantable element in a substrate which comprises:
    (a) selecting an implantable element and a substrate material to be implanted which, at the temperature to be used for the implantation:
        (i) have limited mutual solubility in one another; and
        (ii) do not form intermediate phases with one another; and
    (b) implanting a sufficient amount of the implantable element to form said desired substantially pure layer of the implantable element in the substrate material.

2. The process of claim 1 wherein said implanted substrate is annealed at a temperature not exceeding about 10° C. below the melting point of the substrate to form said substantially pure layer.

3. The process of claim 2 wherein said implanted substrate is annealed at a temperature which ranges from at least about 20° C. up to about 10° C. below the melting point of the substrate to form said substantially pure layer.

4. The process of claim 1 wherein at least about $5 \times 10^{16}$ atoms/cm$^2$ of said implantable element are implanted in said substrate material to form said substantially pure layer therein.

5. The process of claim 2 wherein at least about $5 \times 10^{17}$ atoms/cm$^2$ of said implantable element are implanted in said substrate material to form said substantially pure layer therein.

6. The process of claim 1 wherein the solubility of said implantable element in said substrate material is less than about 10 at. %.

7. The process of claim 1 wherein the solubility of said implantable element in said substrate material is less than about 5 at. %.

8. The process of claim 1 wherein the solubility of said substrate material in said implantable element is less than about 10 at. %.

9. The process of claim 1 wherein he solubility of said substrate material in said implantable element is less than about 5 at. %.

10. The process of claim 1 wherein said implantation step is carried out at a temperature ranging from about -196° C. to about 10° C. below the melting point of the substrate.

11. The process of claim 1 wherein said implantation step is carried out at a temperature within the implantation temperature range to permit formation of said substantially pure layer of said implantable element without a post-implant annealing step.

12. The process of claim 1 wherein said implantable element is implanted into said substrate at an energy ranging from about 5 keV to about 2000 keV 13. The process of claim 1 wherein said implantation is carried out in the presence of a gas capable of reducing sputtering of said substrate materials during the implantation process.

14. The process of claim 13 wherein said gas capable of inhibiting sputtering during said implantation process is selected from the class consisting of oxygen, water vapor, carbon dioxide, and nitrogen.

15. The process of claim 1 including the further step of providing a coating on said substrate which will inhibit sputtering during said implantation process.

16. The process of claim 1 including the further step of exposing said substantially pure implanted layer after said implantation step by removing the surface layer of said substrate to expose said implanted layer.

17. The process of claim 16 wherein said step of removing a portion of said substrate to expose said implanted layer is carried out by sputtering, wet etching, dry etching, or by mechanical means.

18. The process of claim 1 wherein said implantation step comprises forming a shallow implant of said implantable element to form said substantially pure implanted layer so as to be exposed adjacent to the surface of said substrate.

19. The process of claim 1 wherein said implantation step is carried out two or more times at different energies to thereby form two or more of said substantially pure layers in said substrate.

20. The process of claim 19 wherein said two or more implantation steps are carried out using the same implantable element to form two or more layers of the same implanted element in said substrate.

21. The process of claim 19 wherein said two or more implantation steps are carried out using different implantable elements to form two or more layers of different implanted elements in said substrate.

22. The process of claim 1 wherein said step of forming said substantially pure layer in said substrate further includes forming a patterned buried layer in said substrate.

23. The process of claim 22 wherein said patterned layer in said substrate is formed by the step of masking said substrate prior to said implantation step.

24. The process of claim 22 wherein said patterned layer is formed in said substrate by using a focused ion beam to implant a pattern layer in said substrate.

25. A process for implanting a substantially pure layer of an implantable element in a substrate which comprises:
  (a) selecting an implantable element and a substrate to be implanted wherein, at the temperature to be used for the implantation:
    (i) the solubilities of said implantable element and said substrate material in one another are less than 10 at. % ; and
    (ii) no intermediate phases containing both said implantable element and said substrate material exist; and
  (b) implanting, at a temperature ranging from about $-196$°C. to about 10° C. below the melting point of the substrate, at least about $5 \times 10^{16}$ atoms/cm$^2$ of said implantable element in said substrate;
to form said layer of said implantable element having a purity of at least about 90 at. % in said substrate.

26. A process for forming a substantially pure layer of an implantable element in a substrate which comprises:
  (a) selecting an implantable element and a substrate to be implanted wherein, at the temperature to be used for the implantation and annealing:
    (i) the solubilities of said implantable element and said substrate material in one another are less than 10 at. % ; and
    (ii) no intermediate phases containing both said implantable element and said substrate material exist;
  (b) implanting, at a temperature ranging from about $-196$° C. to about 10° C. below the melting point of the substrate, at least about $5 \times 10^{16}$ atoms/cm$^2$ of said implantable element in said substrate; and
  (c) annealing said implanted substrate at a temperature ranging from about 20° C. to about 10° C. below the melting point of the substrate for a period of about 1 second to about 100 hours;
to form said layer of said implantable element having a purity of at least about 90 at. % in said substrate 27. A process for producing a substantially pure layer of aluminum in a beryllium substrate which comprises:
  (a) implanting aluminum ions into a beryllium substrate at an energy of about 200 keV and a fluence of at least about $1.1 \times 10^{18}$ atoms/cm$^2$ while maintaining the temperature below about 150° C.; and
  (b) annealing said implanted beryllium substrate at a temperature of from about 400° C. to just below 570° C. for a period of from about 0.2 to 4 hours;
to form said layer of substantially pure aluminum in said beryllium substrate

* * * * *